(12) United States Patent
McPherson et al.

(10) Patent No.: US 12,400,986 B2
(45) Date of Patent: *Aug. 26, 2025

(54) PACKAGE FOR POWER ELECTRONICS

(71) Applicant: Wolfspeed, Inc., Durham, NC (US)

(72) Inventors: Brice McPherson, Fayetteville, AR (US); Daniel Martin, Fayetteville, AR (US); Jennifer Stabach, Fayetteville, AR (US)

(73) Assignee: Wolfspeed, Inc., Durham, NC (US)

( * ) Notice: Subject to any disclaimer, the term of this patent is extended or adjusted under 35 U.S.C. 154(b) by 14 days.

This patent is subject to a terminal disclaimer.

(21) Appl. No.: 18/530,496

(22) Filed: Dec. 6, 2023

(65) Prior Publication Data

US 2024/0105651 A1 Mar. 28, 2024

Related U.S. Application Data

(60) Continuation of application No. 17/352,965, filed on Jun. 21, 2021, now Pat. No. 11,887,953, which is a
(Continued)

(51) Int. Cl.
*H01L 23/00* (2006.01)
*H01L 21/66* (2006.01)
(Continued)

(52) U.S. Cl.
CPC .............. *H01L 24/09* (2013.01); *H01L 24/49* (2013.01); *H01L 25/072* (2013.01); *H01L 22/14* (2013.01);
(Continued)

(58) Field of Classification Search
CPC ......... H01L 22/14; H01L 22/30; H01L 22/32; H01L 23/49541; H01L 23/49548;
(Continued)

(56) References Cited

U.S. PATENT DOCUMENTS 4,953,060 A  8/1990 Lauffer et al.
5,492,842 A  2/1996 Eytcheson et al.
(Continued)

FOREIGN PATENT DOCUMENTS

EP  2899757 A1  7/2015
EP  3057126 A1  8/2016
(Continued)

OTHER PUBLICATIONS

International Patent Application No. PCT/US2024/035720; Int'l Search Report and the Written Opinion; dated Sep. 19, 2024; 32 pages.
(Continued)

*Primary Examiner* — David A Zarneke
(74) *Attorney, Agent, or Firm* — BakerHostetler

(57) ABSTRACT

A package for power electronics includes a power substrate, a number of power semiconductor die, and a Kelvin connection contact. Each one of the power semiconductor die are on the power substrate and include a first power switching pad, a second power switching pad, a control pad, a semiconductor structure, and a Kelvin connection pad. The semiconductor structure is between the first power switching pad, the second power switching pad, and the control pad, and is configured such that a resistance of a power switching path between the first power switching pad and the second power switching pad is based on a control signal provided at the control pad. The Kelvin connection pad is coupled to the power switching path. The Kelvin connection contact is coupled to the Kelvin connection pad of each one of the power semiconductor die via a Kelvin conductive trace on the power substrate.

27 Claims, 8 Drawing Sheets

Related U.S. Application Data division of application No. 16/441,925, filed on Jun. 14, 2019, now Pat. No. 11,069,640.

(51) Int. Cl.
  *H01L 23/495* (2006.01)
  *H01L 25/07* (2006.01)

(52) U.S. Cl.
  CPC .............. *H01L 22/30* (2013.01); *H01L 22/32* (2013.01); *H01L 23/49541* (2013.01); *H01L 23/49548* (2013.01); *H01L 23/49558* (2013.01); *H01L 23/49562* (2013.01); *H01L 23/49575* (2013.01); *H01L 2224/04042* (2013.01); *H01L 2924/13055* (2013.01); *H01L 2924/13091* (2013.01); *H01L 2924/30101* (2013.01)

(58) Field of Classification Search
  CPC ......... H01L 23/49575; H01L 23/49562; H01L 23/49558
  See application file for complete search history.

(56) References Cited

U.S. PATENT DOCUMENTS

| | | | |
|---|---|---|---|
| 5,519,253 | A | 5/1996 | Lake et al. |
| 5,563,447 | A | 10/1996 | Lake et al. |
| 5,691,568 | A | 11/1997 | Chou et al. |
| 5,869,898 | A | 2/1999 | Sato |
| 6,521,966 | B1 | 2/2003 | Ishio et al. |
| 7,547,964 | B2 | 6/2009 | Pavier et al. |
| 9,704,979 | B2 | 7/2017 | Muto et al. |
| 10,084,442 | B2 | 9/2018 | Ikeda et al. |
| 10,141,254 | B1 | 11/2018 | Xu et al. |
| 10,265,212 | B2 | 4/2019 | Robichaud et al. |
| 10,389,265 | B2 | 8/2019 | Yoshinaga et al. |
| 10,700,681 | B1 | 6/2020 | Xu et al. |
| 10,720,913 | B1 | 7/2020 | Leong et al. |
| 10,720,914 | B1 | 7/2020 | Koyama et al. |
| 11,069,640 | B2* | 7/2021 | McPherson ........... H01L 25/072 |
| 11,756,910 | B2* | 9/2023 | McPherson ............. H01L 24/49 257/690 |
| 11,887,953 | B2* | 1/2024 | McPherson ........... H01L 25/072 |
| 2004/0157372 | A1 | 8/2004 | Manatad |
| 2013/0332750 | A1 | 12/2013 | Souma |
| 2014/0159054 | A1 | 6/2014 | Otake et al. |
| 2014/0191768 | A1 | 7/2014 | Engl |
| 2015/0054159 | A1 | 2/2015 | Hoegerl et al. |
| 2015/0216067 | A1 | 7/2015 | McPherson et al. |
| 2016/0308523 | A1 | 10/2016 | Otake et al. |
| 2017/0162403 | A1 | 6/2017 | Terrill et al. |
| 2017/0294373 | A1 | 10/2017 | Rowden et al. |
| 2018/0047656 | A1 | 2/2018 | Mkhitarian et al. |
| 2018/0114740 | A1 | 4/2018 | Liu et al. |
| 2018/0145007 | A1 | 5/2018 | Hatano et al. |
| 2018/0206359 | A1 | 7/2018 | McPherson et al. |
| 2018/0286792 | A1 | 10/2018 | Gajda et al. |
| 2019/0229043 | A1 | 7/2019 | Chen |
| 2019/0295929 | A1 | 9/2019 | Takagi et al. |
| 2019/0326255 | A1 | 10/2019 | Olson et al. |
| 2021/0134738 | A1 | 5/2021 | Cheng et al. |
| 2021/0296881 | A1 | 9/2021 | Minagawa |
| 2021/0313243 | A1 | 10/2021 | McPherson |
| 2022/0045506 | A1 | 2/2022 | Wang et al. |
| 2023/0142930 | A1 | 5/2023 | McPherson et al. |

FOREIGN PATENT DOCUMENTS

| | | |
|---|---|---|
| EP | 3073641 A1 | 9/2016 |
| JP | 2013-012560 A | 1/2013 |
| JP | 2013-258387 A | 12/2013 |
| JP | 2015-076442 A | 4/2015 |
| JP | 2015-126342 A | 7/2015 |
| JP | 2017-098356 A | 6/2017 |
| JP | 2019-514216 A | 5/2019 |
| JP | D1747044 S | 6/2023 |
| WO | WO 2013/179547 A1 | 12/2013 |
| WO | WO 2014/046058 A1 | 3/2014 |
| WO | WO 2015/076257 A1 | 5/2015 |
| WO | WO 2016/009496 A1 | 1/2016 |
| WO | WO 2018/020953 A1 | 2/2018 |
| WO | WO 2018/043535 A1 | 3/2018 |
| WO | WO 2018/056213 A1 | 3/2018 |
| WO | WO 2018/235137 A1 | 12/2018 |
| WO | WO 2019/044748 A1 | 3/2019 |
| WO | WO 2022/207202 A1 | 10/2022 |

OTHER PUBLICATIONS

"Automotive-grade silicon carbide Power MOSFET 650 V, 100 A, 20 mΩ (typ., TJ=25° C.), in an HiP247™ package," SCTW100N65G2AG Datasheet, D811843—Rev. 2, Nov. 2018, STMicroelectronics, 11 pages.

Invitation to Pay Additional Fees and Partial Search for International Patent Application No. PCT/US2020/036258, dated Sep. 25, 2020, 17 pages.

International Search Report and Written Opinion for International Patent Application No. PCT/US2020/036258, dated Nov. 25, 2020, 22 pages.

Non-Final Office Action for U.S. Appl. No. 16/441,925, mailed Aug. 25, 2020, 16 pages.

Final Office Action for U.S. Appl. No. 16/441,925, mailed Dec. 14, 2020, 17 pages.

Advisory Action and Examiner-Initiated Interview Summary for U.S. Appl. No. 16/441,925, mailed Feb. 24, 2021, 3 pages.

Notice of Allowance for U.S. Appl. No. 16/441,925, mailed Mar. 17, 2021, 9 pages.

Corrected Notice of Allowability and Applicant-Initiated Interview Summary for U.S. Appl. No. 16/441,925, mailed Apr. 23, 2021, 6 pages.

Author Unknown, "Automotive-grade silicon carbide Power MOSFET 1200 V, 9.3 mΩ typ., 170 A in a STPAK package", SCTHS200N120G3AG Datasheet, DS14089—Rev 1, Oct. 2022, STMicroelectronics; 11 pages.

Automotive-grade silicon carbide Power MOSFET 1200 V, 9.3 mΩ typ., 170 A in a STPAK package; SCTHS200N120G3AG; Datasheet; DS14089—Rev 1; Oct. 2022; ST; 11 pages.

International Patent Application No. PCT/US2023/084493; Int'l Search Report and the Written Opinion; dated Mar. 22, 2024; 13 pages.

* cited by examiner

FIG. 3

PACKAGE FOR POWER ELECTRONICS

RELATED APPLICATIONS

This application is a continuation of U.S. patent application Ser. No. 17/352,965, filed Jun. 21, 2021; which application is a division of U.S. patent application Ser. No. 16/441,925, filed Jun. 14, 2019, the disclosures of which are hereby incorporated herein by reference in their entirety.

FIELD OF THE DISCLOSURE

The present disclosure is related to packages for power electronics, and in particular to packages for power electronics including two or more paralleled power semiconductor die therein.

BACKGROUND

FIG. 1 shows a top-down view of a conventional discrete package 10 for power electronics. The conventional discrete package 10 is a leadframe package including a power substrate 12, a first power switching contact 14, a second power switching contact 16, a control contact 18, and a Kelvin connection contact 20. The first power switching contact 14, the second power switching contact 16, the control contact 18, and the Kelvin connection contact 20 form part of a leadframe array of the conventional discrete package 10. The power substrate 12 includes a power switching conductive trace 22 and a control trace 24, each of which is separated from the other by a portion of insulating material such that the power switching conductive trace 22 is electrically isolated from the control trace 24. A number of power semiconductor die 26 are provided on the power switching conductive trace 22 such that a first power switching pad 28 on a backside of each one of the power semiconductor die 26 is electrically coupled to the power switching conductive trace 22. On top of each one of the power semiconductor die 26 opposite the backside, the power semiconductor die 26 include a second power switching pad 30 (which is divided into two parts), and a control pad 32.

Each one of the power semiconductor die 26 are transistors coupled in parallel to form a single switching position. Accordingly, each one of the power semiconductor die 26 includes a semiconductor structure located between the first power switching pad 28, the second power switching pad 30, and the control pad 32, which is configured such that a resistance of a power switching path between the first power switching pad 28 and the second power switching pad 30 is based on a control signal provided at the control pad 32. The first power switching contact 14 is coupled to the first power switching conductive trace 22 such that the first power switching contact 14 is coupled to the first power switching pad 28 of each one of the power semiconductor die 26. The second power switching contact 16 is coupled to the second power switching pad 30 of each one of the power semiconductor die 26. The control contact 18 is coupled to the second power switching contact 16. The control trace 24 is in turn coupled to the control pad 32 of each one of the power semiconductor die 26 by one or more wirebonds 34 such that the control contact 18 is coupled to the control pad 32 of each one of the power semiconductor die 26. A power switching loop is formed between the first power switching contact 14 and the second power switching contact 16. A signal loop is formed between the control contact 18 and the Kelvin connection contact 20. Control signals are provided between the control contact 18 and the Kelvin connection contact 20 (i.e., across the signal loop) in order to control a resistance between the first power switching contact 14 and the second power switching contact 16 (i.e., across the power switching loop).

Notably, the second power switching contact 16 and the Kelvin connection contact 20 are not separately coupled to the power semiconductor die 26. That is, the second power switching contact 16 and the Kelvin connection contact 20 are first coupled to one another, then coupled to the second power switching pad 30 of each one of the power semiconductor die 26. As a result, there is some amount of metal between the point at which the second power switching contact 16 is coupled to the Kelvin connection contact 20 and the point at which the combined second power switching contact 16 and Kelvin connection contact 20 are coupled to each one of the power semiconductor die 26. This metal has an associated impedance, which introduces coupling between the power switching loop and the signal loop.

Coupling between the power switching loop and the signal loop causes feedback between the loops, which causes significant problems such as a reduction in switching quality, slower switching speeds, increased losses, and possible destruction of the power semiconductor die 26. In light of the above, there is a need for improved discrete power packages for power electronics.

SUMMARY

In one embodiment, a package for power electronics includes a power substrate, a number of power semiconductor die, and a Kelvin connection contact. Each one of the power semiconductor die are on the power substrate and include a first power switching pad, a second power switching pad, a control pad, a semiconductor structure, and a Kelvin connection pad. The semiconductor structure is between the first power switching pad, the second power switching pad, and the control pad, and is configured such that a resistance of a power switching path between the first power switching pad and the second power switching pad is based on a control signal provided at the control pad. The Kelvin connection pad is coupled to the second power switching pad on the power semiconductor die. The Kelvin connection contact is coupled to the Kelvin connection pad of each one of the power semiconductor die via a Kelvin conductive trace on the power substrate. Connecting the Kelvin connection pad of each one of the power semiconductor die to the Kelvin connection contact via a conductive trace on the power substrate significantly simplifies the layout of the discrete package and reduces the length of connections between the Kelvin connection contact and the power semiconductor die, thereby improving the performance of the discrete package.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 3 shows a top-down schematic view of a discrete package for power electronics according to one embodiment of the present disclosure.

DETAILED DESCRIPTION

Figure 1:
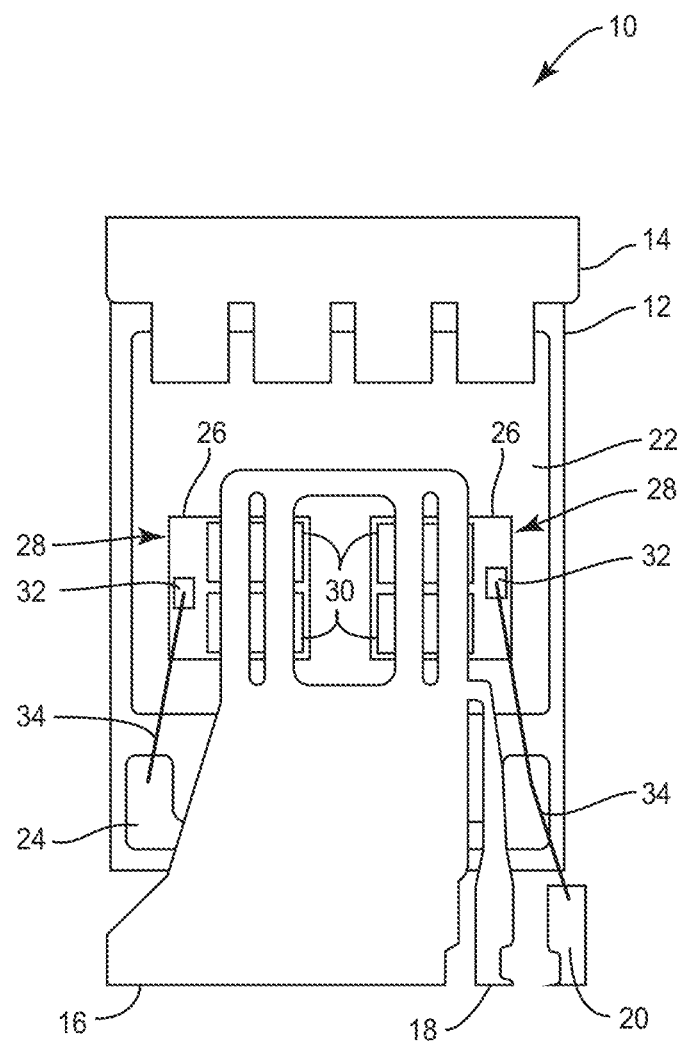
FIG. 1 shows a top-down schematic view of a conventional discrete package for power electronics.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Power packages can generally be categorized as either power modules or discrete packages. Power modules often contain greater numbers of power semiconductor die (e.g., >2) than discrete packages and include a power substrate, power contacts, signal contacts, and a base plate in some configurations. The power substrate in a power module is used for electrical interconnection as well as electrical isolation. The base plate provides structural support and heat spreading. Internally, power modules often comprise a topology (or arrangement) of the power semiconductor die therein to form an electrical circuit (e.g., a half-bridge, full-bridge, three-phase, etc.) Power modules are generally either molded or protected by a housing and an encapsulating material.

Discrete packages are different from modules in that they are formed on a metal lead frame array with fewer power semiconductor die (e.g., 1-2). They may or may not have a power substrate, which provides electrical isolation. The lead frame array is trimmed and formed to create power and signal connections. The assembly is molded for electrical isolation, mechanical support, and protection from the ambient environment (moisture, etc.) Discrete packages typically house a single switch position, often with a single power semiconductor die such as a metal-oxide semiconductor field-effect transistor (MOSFET), insulated gate bipolar transistor (IGBT), or the like, with or without an antiparallel diode.

There are two electrical loops of importance in a power package: (1) the power loop (e.g., drain-source or collector-emitter) and (2) the signal loop (e.g., gate-source or gate-emitter). The power loop is the high voltage, high current path through the switch that delivers power to a load. The signal loop is the low voltage, low current path for controlling the power loop (i.e., actuating turn-on and turn-off). For optimal switching performance, the power loop and the signal loop should be completely independent of each other. Ensuring the independence of the power loop and the signal loop allows low switching loss with fast, well controlled dynamics.

The power loop and the signal loop are both connected to the source (or emitter) of the power semiconductor die in the power package. If the power loop couples into the signal loop, extra dynamics are introduced through either positive or negative feedback. Typically, negative feedback introduces extra losses as the power path coupling fights the control signal (i.e., the power path coupling tries to turn the power semiconductor die off when the control signal is trying to turn the device on). Positive feedback typically causes instability as the power path coupling amplifies the control signal until the power semiconductor die are destroyed. Ultimately, the coupling of the power loop and the signal loop results in a reduction in switching quality, slower switching speeds, increased losses, and possible destruction of the power semiconductor die.

In light of the above, it is desirable to ensure the independence of the power loop and the control loop in a power package. One way to accomplish this is by using a source Kelvin connection (or emitter Kelvin connection). A Kelvin connection is separately coupled to the source or the emitter for actuating purposes. Generally, the closer the separate connections from the power loop and the signal loop are made to the power semiconductor die, the better the switching performance that can be achieved. Ideally, a Kelvin connection would be made to the source or emitter through a separate path such as a separate wirebond, interconnect, etc. which is independent of the power loop.

While Kelvin connections have been used for some time in both power modules and discrete packages, they significantly complicate the layout of the power semiconductor die therein. True Kelvin connections require a separate path to the source or emitter of the semiconductor die, which requires additional wirebonds or interconnects. These additional wirebonds or interconnects create complicated layout issues.

To avoid the complicated layout issues discussed above, discrete packages often include only a single power semiconductor die and multiple discrete packages are paralleled using external connections (as opposed to paralleling multiple semiconductor die within a discrete package). While this does effectively increase current carrying capacity, switching of the paralleled discrete packages must be slowed down at the gate driver level to ensure balanced switching between the packages, since the external connections between the packages introduce a significant amount of inductance. In addition, individual gate resistors must be added to avoid high frequency oscillations created by a positive feedback mechanism introduced by the transconductance and stray inductance of the semiconductor die in the paralleled packages. Finally, paralleling packages results in a large amount of required area for a given solution.

In addition to the layout challenges discussed above, paralleling power semiconductor die in a discrete package presents an additional issue in the form of transconductance mismatches between the power semiconductor die. During switching of a power semiconductor die, the input voltage rises and results in an associated rise in output current. If there is a difference in the transconductance of two parallel power semiconductor die, they will each have slightly different turn on characteristics. Accordingly, during switching a different amount of current will be running through each power semiconductor die and thus a different voltage will be present across each power semiconductor die. The voltage mismatch across the power semiconductor die will result in a balancing current that flows between the power semiconductor die during switching.

The balancing current will prefer the path of least resistance, which could be through the signal loop instead of the power loop. Like the issues of interference that result from coupling between the power loop and the signal loop, the balancing current can also affect switching quality. Further, the balancing current can also introduce reliability concerns if it runs through the signal loop.

In light of the above, there is a present need for improved power packages, and in particular for improved power discrete packages including a number of paralleled power semiconductor die therein.

Figure 2:
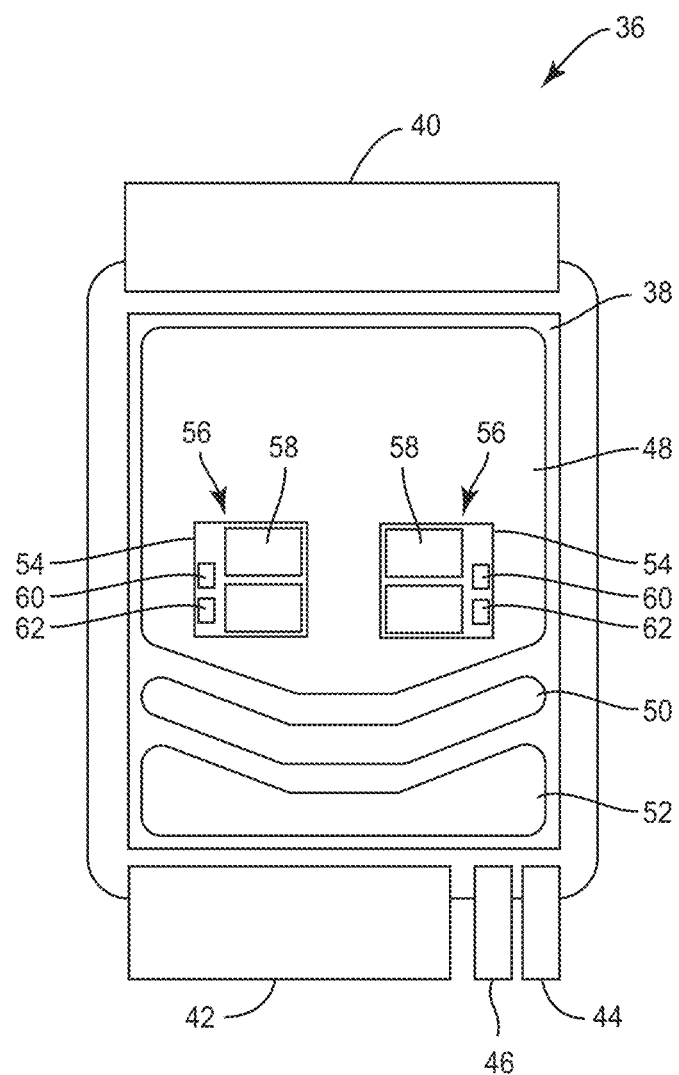
FIG. 2 shows a top-down schematic view of a discrete package for power electronics according to one embodiment of the present disclosure.

FIG. 2 shows a top-down view of a discrete package 36 for power electronics according to one embodiment of the present disclosure. The discrete package 36 is a leadframe package including a power substrate 38, a first power switching contact 40, a second power switching contact 42, a control contact 44, and a Kelvin connection contact 46. The first power switching contact 40, the second power switching contact 42, the control contact 44, and the Kelvin connection contact 46 form all or part of a leadframe array of the discrete package 36. The power substrate 38 includes a power switching conductive trace 48, a control conductive trace 50, and a Kelvin conductive trace 52, each of which is separated from the other by a portion of insulating material such that the power switching conductive trace 48, the control conductive trace 50, and the Kelvin conductive trace 52 are electrically isolated from one another. A number of power semiconductor die 54 are provided on the power switching conductive trace 48 such that a first power switching pad 56 on a backside of each one of the power semiconductor die 54 is electrically coupled to the power switching conductive trace 48. On top of each one of the power semiconductor die 54 opposite the backside, the power semiconductor die 54 include a second power switching pad 58 (which is divided into two parts), a control pad 60, and a Kelvin connection pad 62.

Each one of the power semiconductor die 54 are transistors coupled in parallel to form a single switching position. Each one of the power semiconductor die 54 includes a semiconductor structure (not shown) located between the first power switching pad 56, the second power switching pad 58, and the control pad 60, which is configured such that a resistance of a power switching path between the first power switching pad 56 and the second power switching pad 58 is based on a control signal provided at the control pad 60. The Kelvin connection pad 62 is coupled to the second power switching pad 58 on the power semiconductor die 54. In one embodiment, each one of the power semiconductor die 54 are MOSFETs such that the first power switching pad 56 is coupled to a drain region of the semiconductor structure, the second power switching pad 58 and the Kelvin connection pad 62 are coupled to a source region of the semiconductor structure, and the control pad 60 is coupled to a gate region of the semiconductor structure. In another embodiment, each one of the power semiconductor die 54 are IGBTs such that the first power switching pad 56 is coupled to a collector region of the semiconductor structure, the second power switching pad 58 and the Kelvin connection pad 62 are coupled to an emitter region of the semiconductor structure, and the control pad 60 is coupled to a gate region of the semiconductor structure.

While not shown in FIG. 2, the first power switching contact 40 is coupled to the first power switching pad 56 of each one of the power semiconductor die 54, the second power switching contact 42 is coupled to the second power switching pad 58 of each one of the power semiconductor die 54, the control contact 44 is coupled to the control pad 60 of each one of the power semiconductor die 54, and the Kelvin connection contact 46 is coupled to the Kelvin connection pad 62 of each one of the power semiconductor die 54. The connections between the contacts and the pads may be made by any suitable interconnects such as direct attachment, wirebonds, or any other suitable means. As discussed below, the control conductive trace 50 and the Kelvin conductive trace 52 allow for connection between the contacts of the discrete package 36 and the power semiconductor die 54 without significant overlap or complicated layout schemes.

Figure 3:
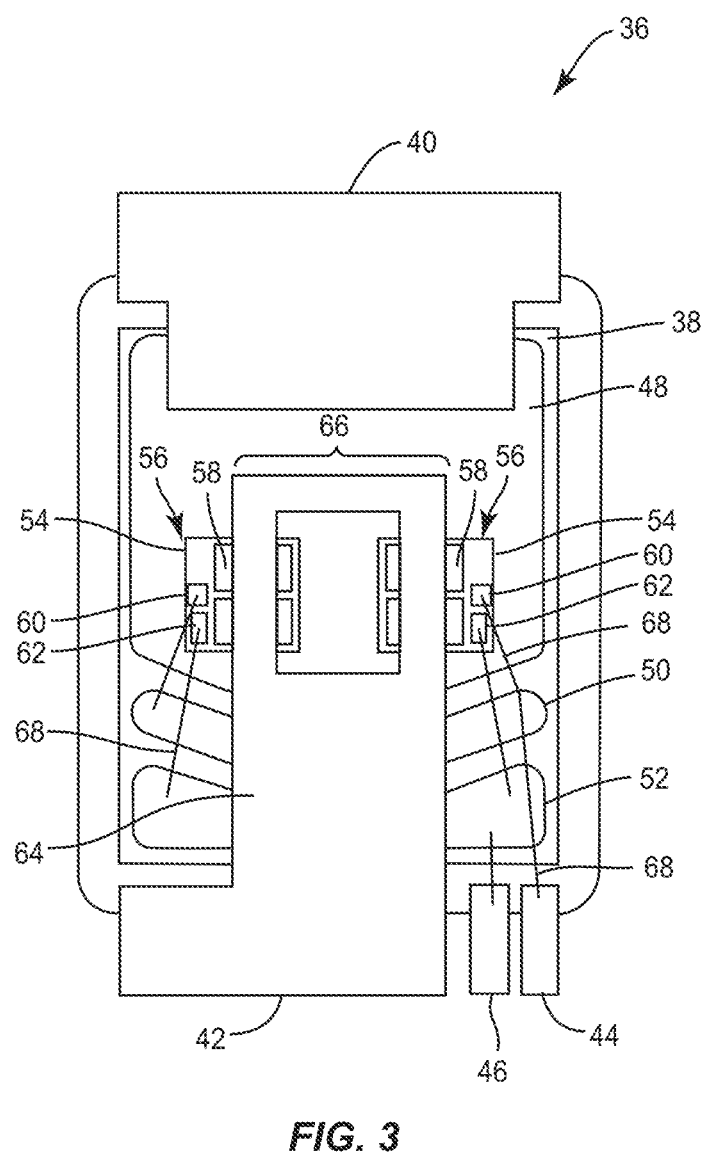

FIG. 3 shows the discrete package 36 according to one embodiment of the present disclosure. As illustrated in FIG. 3, the first power switching contact 40 is coupled to the power switching conductive trace 48 via direct contact attach. The direct contact attach may be accomplished with solder, conductive epoxy, sintered metal, or the like. As discussed above, the power semiconductor die 54 are provided on the power switching conductive trace 48 such that a first power switching pad 56 thereof is in electrical contact with the power switching conductive trace 48. Accordingly, the first power switching contact 40 is coupled to the first power switching pad 56 of each one of the power semiconductor die 54. The second power switching contact 42 is coupled to the second power switching pad 58 of each one of the power semiconductor die 54 via a direct contact attach. Once again, the direct contact attach may be accomplished with solder, conductive epoxy, sintered metal, or the like. As illustrated, a metal structure 64 is provided over the second power switching pad 58 of each one of the power semiconductor die 54 to enable the direct attachment. Notably, a portion of the metal structure 66 couples the second power switching pad 58 of each one of the power semiconductor die 54 separately from the connection of the second power switching contact 42 and the second power switching pad 58. This portion of the metal structure 66 acts as a balancing connection to reduce voltage differences across the power semiconductor die 54 during turn on and turn off due to transconductance mismatches. This may reduce or eliminate the balancing current discussed above and thereby improve the performance of the discrete package 36.

The control pad 60 of each one of the power semiconductor die 54 is coupled to the control conductive trace 50 via one or more wirebonds 68, which is in turn coupled to the control contact 44 via one or more wirebonds 68. Notably, a portion of the control conductive trace 50 runs parallel to the power switching conductive trace 48, and thus for both of the power semiconductor die 54 there is a short length between the control pad 60 thereof and the control conductive trace 50. The length of the wirebonds 68 between the control pad 60 and the control conductive trace 50 may thus be kept short, thereby minimizing stray inductance and providing flexibility in the layout of the power semiconductor die 54 and the wirebonds 68. To further reduce the required length of the wirebonds 68, the control conductive trace 50 is angled with respect to the edges of the power substrate 38 as shown. In particular, the power switching conductive trace 48 is provided having at least one edge that is not parallel to an edge of the power substrate 38. The control conductive trace 50 is similarly provided having at least one edge that is not parallel to an edge of the power substrate 38, but is parallel to the at least one edge of the power switching conductive trace 48. As shown, these edges form a subtle "V" or "U" shape. This further reduces the required length of the wirebonds 68 between the control pad 60 of each one of the power semiconductor die 54 and the control conductive trace 50.

The Kelvin connection pad 62 of each one of the power semiconductor die 54 is coupled to the Kelvin conductive trace 52 via one or more wirebonds 68, which is in turn coupled to the Kelvin connection contact 46 via one or more wirebonds 68. A power switching loop is formed between the first power switching contact 40 and the second power switching contact 42. A signal loop is formed between the control contact 44 and the Kelvin connection contact 46. Control signals are provided between the control contact 44 and the Kelvin connection contact 46 (i.e., across the signal loop) in order to control a resistance between the first power switching contact 40 and the second power switching contact 42 (i.e., across the power loop). While a Kelvin connection pad 62 is shown on each one of the power semiconductor die 54, the power semiconductor die 54 may be also be provided without a separate Kelvin connection pad such that the Kelvin connection contact 46 is coupled to the second power switching pad 60 of each one of the power semiconductor die 54. Such an embodiment will provide the same benefits as discussed herein so as long as the signal paths for the power loop and the signal loop remain separate (i.e., the Kelvin connection contact 46 is coupled to the second power switching pad 60 via a separate wirebond or interconnect than the second power switching contact 42).

Similar to the control conductive trace 50 discussed above, the Kelvin conductive trace 52 also includes at least one edge that is not parallel to an edge of the power substrate 38, but is parallel to the at least one edge of the power switching conductive trace 48. Providing the Kelvin conductive trace 52 in this manner reduces the length of the wirebonds 68 that couple the Kelvin connection pad 62 of each one of the power semiconductor die 54 to the Kelvin conductive trace 52. Providing a conductive trace on the power substrate 38 allows the Kelvin connection contact 46 to be separately coupled to the second power switching pad 58 of each one of the power semiconductor die 54, and in particular allows the Kelvin connection contact 46 to be coupled to the Kelvin connection pad 62 of each one of the power semiconductor die 54. Accordingly, the discrete package 36 provides a true Kelvin connection such that the power loop and signal loop are not coupled. As discussed above, using a Kelvin connection in the signal loop of a discrete package offers significant benefits to the switching speed and stability thereof. Accordingly, the layout of the discrete package 36 allows for improvements to the performance thereof.

Figure 4:
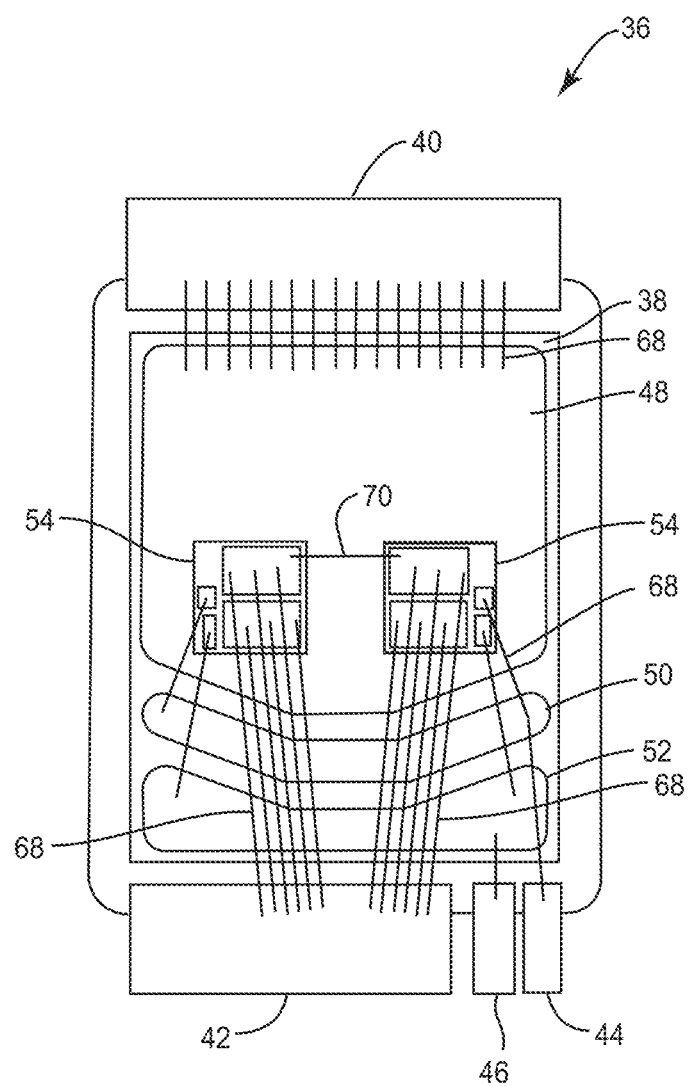
FIG. 4 shows a top-down schematic view of a discrete package for power electronics according to one embodiment of the present disclosure.

In addition to the performance benefits afforded by the layout of the discrete package 36 discussed above, there are also significant benefits provided in the flexibility of the discrete package. For example, rather than directly attaching the first power switching contact 40 to the power switching conductive trace 48 and directly attaching the second power switching contact 42 to the second power switching pad 58 of each one of the power semiconductor die 54, the first power switching contact 40 may be coupled to the power switching conductive trace 48 via a number of wirebonds 68 and the second power switching contact 42 may be coupled to the second power switching pad 58 of each one of the power semiconductor die 54 via a number of wirebonds 68 as shown in FIG. 4. Notably, when wirebonds 68 are used to couple the second power switching contact 42 to the second power switching pad 58 of each one of the power semiconductor die 54, one or more balancing wirebonds 70 are coupled between the second power switching pad 58 of each one of the power semiconductor die 54. As discussed above, this may reduce voltage differences across the power semiconductor die 54 during turn on and turn off due to transconductance mismatches, and thereby reduce or eliminate a balancing current to improve the performance and reliability of the discrete package 36.

Figure 5:
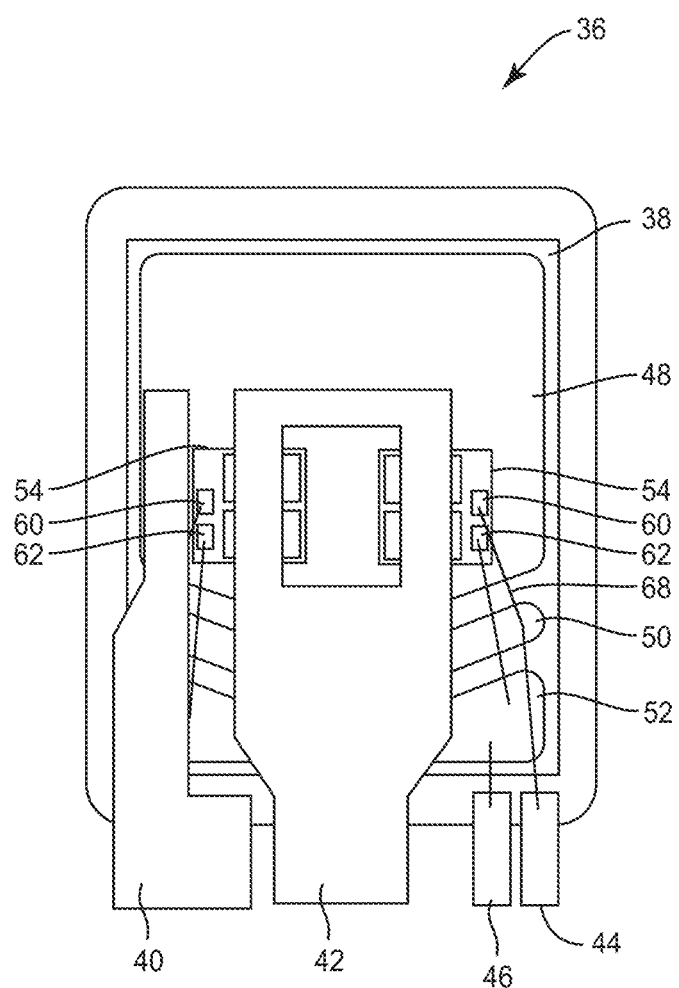
FIG. 5 shows a top-down schematic view of a discrete package for power electronics according to one embodiment of the present disclosure.
Figure 6:
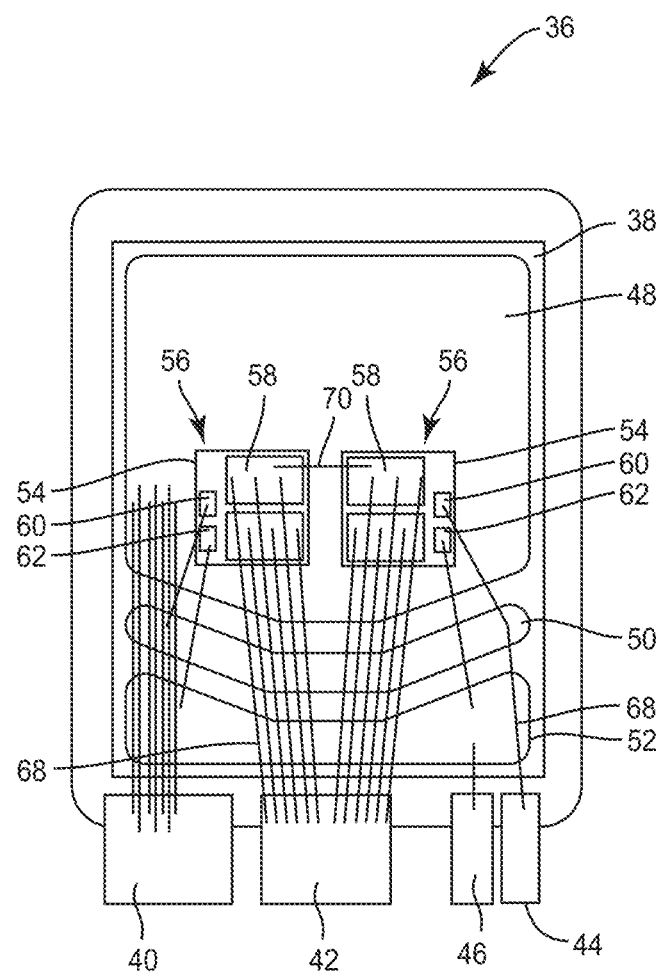
FIG. 6 shows a top-down schematic view of a discrete package for power electronics according to one embodiment of the present disclosure.
Figure 7:
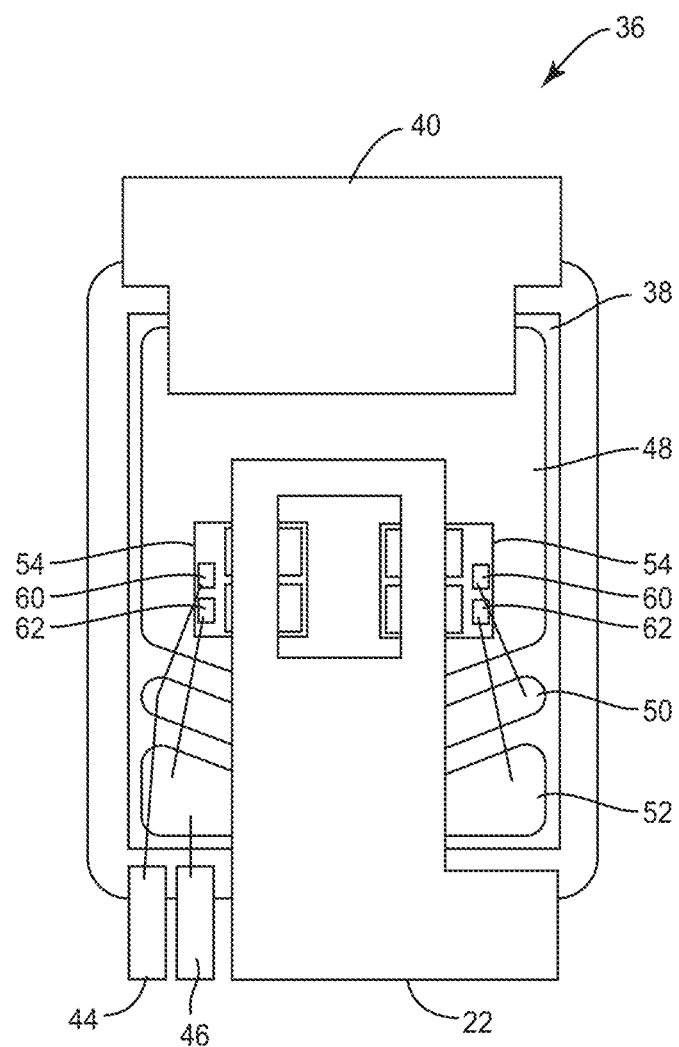
FIG. 7 shows a top-down schematic view of a discrete package for power electronics according to one embodiment of the present disclosure.

Further illustrating the flexibility of the layout of the discrete package 36, FIG. 5 shows the discrete package 36 in which all of the first power switching contact 40, the second power switching contact 42, the control contact 44, and the Kelvin connection contact 46 are located on one side of the discrete package 36. FIG. 6 shows the discrete package 36 wherein the first power switching contact 40, the second power switching contact 42, the control contact 44, and the Kelvin connection contact 46 are located on the same side of the discrete package 36, but wherein the first power switching contact 40 is coupled to the power switching conductive trace 48 via wirebonds 68 rather than directly attached and the second power switching contact 42 is coupled to the second power switching pad 58 of each one of the power semiconductor die 54 via wirebonds 68 rather than directly attached as in FIG. 5. Notably, the configuration of the discrete package 36 shown in FIGS. 5 and 6 is achievable with minimal changes in the discrete package 36 (e.g., the power semiconductor die 54 are moved slightly closer together). FIG. 7 shows the discrete package 36 as in FIG. 2, wherein the location of the second power switching contact 42, the control contact 44, and the Kelvin connection contact 46 are mirrored. FIGS. 5-7 illustrate the flexibility in the discrete package 36, allowing the discrete package 36 to be adapted to a variety of systems.

Figure 8:
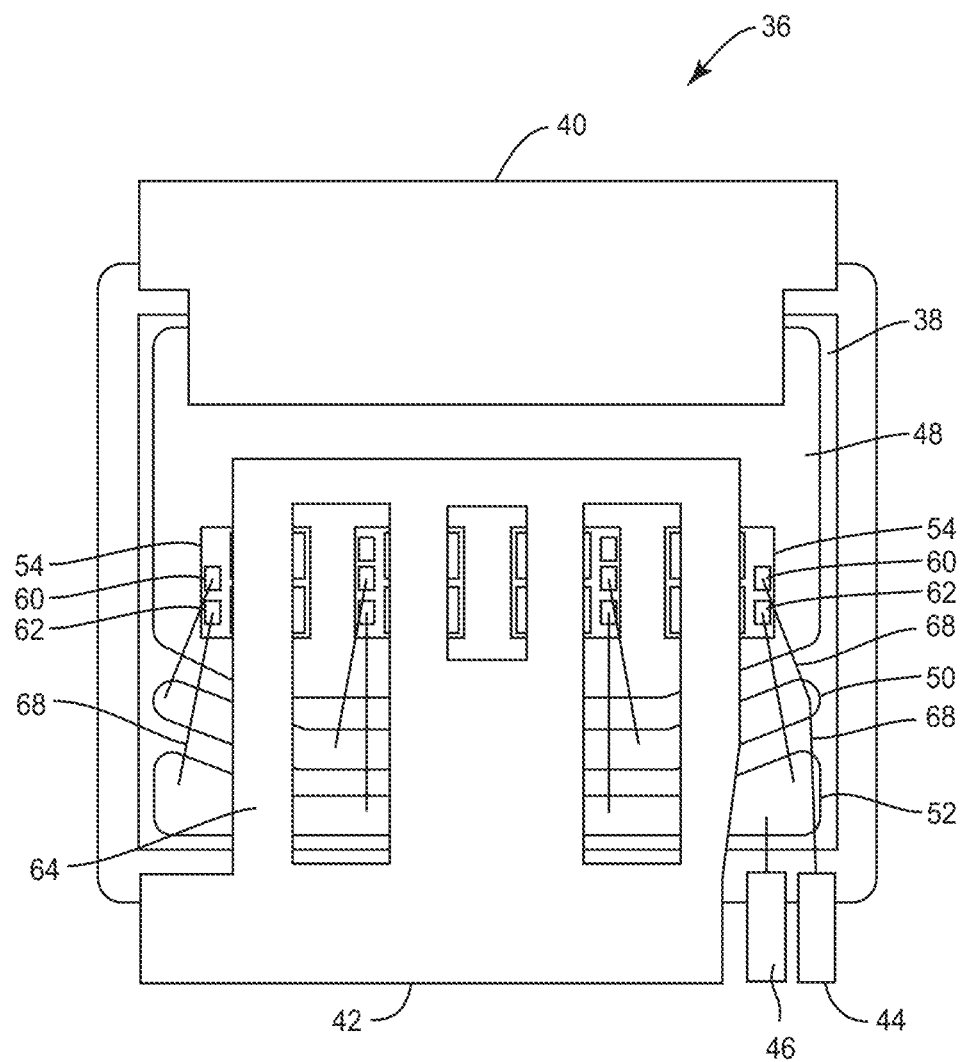
FIG. 8 shows a top-down schematic view of a discrete package for power electronics according to one embodiment of the present disclosure.

While the discrete package 36 is shown above including only two power semiconductor die 54, the principles of the present disclosure apply equally to a discrete package 36 including any number of power semiconductor die 54. Accordingly, FIG. 8 shows the discrete package 36 including four power semiconductor die 54. As shown, the discrete package 36 is substantially similar to that described above. The control conductive trace 50 and the Kelvin conductive trace 52 allow the additional power semiconductor die 54 to be easily coupled to the contacts of the discrete package 36 without complicated routing or layout. While not shown, many additional configurations and layouts of the discrete package 36 are possible, all of which are contemplated herein.

Those skilled in the art will recognize improvements and modifications to the preferred embodiments of the present disclosure. All such improvements and modifications are considered within the scope of the concepts disclosed herein and the claims that follow.

The invention claimed is:

1. A package for power electronics comprising:
a power substrate comprising a plurality of traces;
the plurality of traces comprising at least a Kelvin conductive trace on the power substrate, a control conductive trace on the power substrate, and a power switching conductive trace on the power substrate; and
at least two power semiconductor die on the power switching conductive trace,
wherein at least one of the plurality of traces comprises at least one edge that is angled with respect to edges of the power substrate.

2. The package of claim 1, wherein at least one the plurality of traces comprises at least one edge that is not parallel to any edge of the power substrate.

3. The package of claim 1, wherein at least one the plurality of traces comprises at least one edge that is V-shaped or U-shaped.

4. The package of claim 1, wherein at least one the plurality of traces comprises at least one edge that is not parallel to any edge of the at least two power semiconductor die.

5. The package of claim 1, further comprising:
a first power switching contact; and
a second power switching contact,
wherein the first power switching contact and the second power switching contact are both arranged to extend from a same side of the package past the Kelvin conductive trace and the control conductive trace toward the at least two power semiconductor die.

6. The package of claim 5, further comprising:
a Kelvin connection contact coupled to the Kelvin conductive trace; and
a control contact coupled to the control conductive trace,
wherein the Kelvin connection contact extends from a same side of the package as the first power switching contact and the second power switching contact; and
wherein the control contact extends from a same side of the package as the first power switching contact and the second power switching contact.

7. The package of claim 1, further comprising:
a first power switching contact; and
a second power switching contact,
wherein a width of the first power switching contact is structured to increase from a side of the package toward the at least two power semiconductor die.

8. The package of claim 7, wherein the first power switching contact comprises a structure configured as a balancing connection to reduce voltage differences across the at least two power semiconductor die.

9. The package of claim 1, wherein the control conductive trace is arranged on the power substrate between the power switching conductive trace and the Kelvin conductive trace.

10. A package for power electronics comprising:
a power substrate comprising a plurality of traces;
the plurality of traces comprising at least a Kelvin conductive trace on the power substrate, a control conductive trace on the power substrate, and a power switching conductive trace on the power substrate; and
at least two power semiconductor die on the power switching conductive trace,
wherein at least one the plurality of traces comprises at least one edge that is not parallel to any edge of the power substrate.

11. The package of claim 10, wherein at least one of the plurality of traces comprises at least one edge that is angled with respect to edges of the power substrate.

12. The package of claim 10, wherein at least one the plurality of traces comprises at least one edge that is V-shaped or U-shaped.

13. The package of claim 10, wherein at least one the plurality of traces comprises at least one edge that is not parallel to any edge of the at least two power semiconductor die.

14. The package of claim 10, further comprising:
a first power switching contact; and
a second power switching contact,
wherein the first power switching contact and the second power switching contact are both arranged to extend from a same side of the package past the Kelvin conductive trace and the control conductive trace toward the at least two power semiconductor die.

15. The package of claim 14, further comprising:
a Kelvin connection contact coupled to the Kelvin conductive trace; and
a control contact coupled to the control conductive trace,
wherein the Kelvin connection contact extends from a same side of the package as the first power switching contact and the second power switching contact; and wherein the control contact extends from a same side of the package as the first power switching contact and the second power switching contact.

16. The package of claim 10, further comprising:
a first power switching contact; and
a second power switching contact,
wherein a width of the first power switching contact is structured to increase from a side of the package toward the at least two power semiconductor die.

17. The package of claim 16, wherein the first power switching contact comprises a structure configured as a balancing connection to reduce voltage differences across the at least two power semiconductor die.

18. The package of claim 10, wherein the control conductive trace is arranged on the power substrate between the power switching conductive trace and the Kelvin conductive trace.

19. A package for power electronics comprising:
a power substrate comprising a plurality of traces;
the plurality of traces comprising at least a Kelvin conductive trace on the power substrate, a control conductive trace on the power substrate, and a power switching conductive trace on the power substrate; and
at least two power semiconductor die on the power switching conductive trace,
wherein at least one the plurality of traces comprises at least one edge that is V-shaped or U-shaped.

20. The package of claim 19, wherein at least one of the plurality of traces comprises at least one edge that is angled with respect to edges of the power substrate.

21. The package of claim 19, wherein at least one the plurality of traces comprises at least one edge that is not parallel to any edge of the power substrate.

22. The package of claim 19, wherein at least one the plurality of traces comprises at least one edge that is not parallel to any edge of the at least two power semiconductor die.

23. The package of claim 19, further comprising:
a first power switching contact; and
a second power switching contact,
wherein the first power switching contact and the second power switching contact are both arranged to extend from a same side of the package past the Kelvin conductive trace and the control conductive trace toward the at least two power semiconductor die.

24. The package of claim 23, further comprising:
a Kelvin connection contact coupled to the Kelvin conductive trace; and
a control contact coupled to the control conductive trace,
wherein the Kelvin connection contact extends from a same side of the package as the first power switching contact and the second power switching contact; and
wherein the control contact extends from a same side of the package as the first power switching contact and the second power switching contact.

25. The package of claim 19, further comprising:
a first power switching contact; and
a second power switching contact,
wherein a width of the first power switching contact is structured to increase from a side of the package toward the at least two power semiconductor die.

26. The package of claim 25, wherein the first power switching contact comprises a structure configured as a balancing connection to reduce voltage differences across the at least two power semiconductor die.

27. The package of claim 19, wherein the control conductive trace is arranged on the power substrate between the power switching conductive trace and the Kelvin conductive trace.

* * * * *